(12) United States Patent
Maruyama

(10) Patent No.: US 7,187,019 B2
(45) Date of Patent: Mar. 6, 2007

(54) SOLID STATE IMAGE PICKUP DEVICE AND METHOD OF FABRICATING THE SAME

(75) Inventor: Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/178,926

(22) Filed: Jul. 11, 2005

(65) Prior Publication Data

US 2005/0247991 A1 Nov. 10, 2005

Related U.S. Application Data

(62) Division of application No. 10/705,553, filed on Nov. 11, 2003.

(30) Foreign Application Priority Data

Sep. 26, 2003 (JP) .............................. 2003-334726

(51) Int. Cl.
  *H01L 27/148* (2006.01)
(52) U.S. Cl. ................. 257/223; 257/E31.119
(58) Field of Classification Search ................ 257/222, 257/223, E31.119
  See application file for complete search history.

(56) References Cited

U.S. PATENT DOCUMENTS 6,867,438 B1 * 3/2005 Maruyama et al. .......... 257/184

FOREIGN PATENT DOCUMENTS

JP  2001-135811  * 5/2001

* cited by examiner

*Primary Examiner*—W. David Coleman
(74) *Attorney, Agent, or Firm*—Sonnenchein Nath & Rosenthal LLP (57) ABSTRACT

Disclosed is a solid state image pickup device including a Si substrate, a conductive pattern such as transfer-accumulation electrodes and a buffer wiring formed above the Si substrate, an insulating film provided above the Si substrate in the state of covering the conductive pattern, and a shunt wiring composed of a metallic pattern formed above the insulating film in the state of being connected to the buffer wiring via a contact window formed in the insulating film. The portion of the shunt wiring in the vicinity of the bottom surface of the contact window contains at least one of silicon metal oxide or silicon metal nitride. The solid state image pickup device and a method of fabricating the same make it possible to suppress a rise in the contact resistance attendant on a heat treatment in a later step, in a structure in which various wirings and a light shielding film using a metallic material and a conductive pattern such as a Si substrate and a Si-containing electrode or wiring are brought into contact with each other, to improve propagation characteristics of various signals, and to contribute to provision of an image pickup device with a higher speed, a larger size, a higher image quality, etc.

9 Claims, 6 Drawing Sheets

SOLID STATE IMAGE PICKUP DEVICE AND METHOD OF FABRICATING THE SAME

RELATED APPLICATION DATA

The present application is a divisional patent application of U.S. Ser. No. 10/705,553 filed Nov. 11, 2003, incorporated herein by reference to the extent permitted by law, which claims the benefit of priority to Japanese Application No. JP 2003-334726 filed Sep. 26, 2003.

BACKGROUND OF THE INVENTION

Hitherto, in a transfer portion of a CCD image sensor, for example, a poly-Si (polycrystalline silicon) film is used for constituting a transfer-accumulation electrode disposed on a buried CCD register. However, since the resistance of the poly-Si film is high, in the case where clock rate is high or where transmission distance is long, propagation of a signal transmitted through the transfer-accumulation electrode would be delayed. Particularly, it is difficult to obtain an image pickup device with a higher driving speed and a larger area. In order to solve such a problem, a shunt structure has been used in which a shunt wiring is disposed above the upper side of the transfer-accumulation electrode and a clock signal is supplied to the transfer-accumulation electrode through the shunt wiring, to thereby obviate the clock signal propagation delay and to achieve an image pickup device with a higher speed and a larger area. As the material of the shunt wiring, for example, a high melting point metal such as tungsten, molybdenum, etc., aluminum, or the like is used. In addition, in such an image sensor, a light shielding film for preventing the incidence of light on other regions than a photo-sensor is disposed. For example, a high melting point metal is used as the material of the light shielding film.

Figure 7:
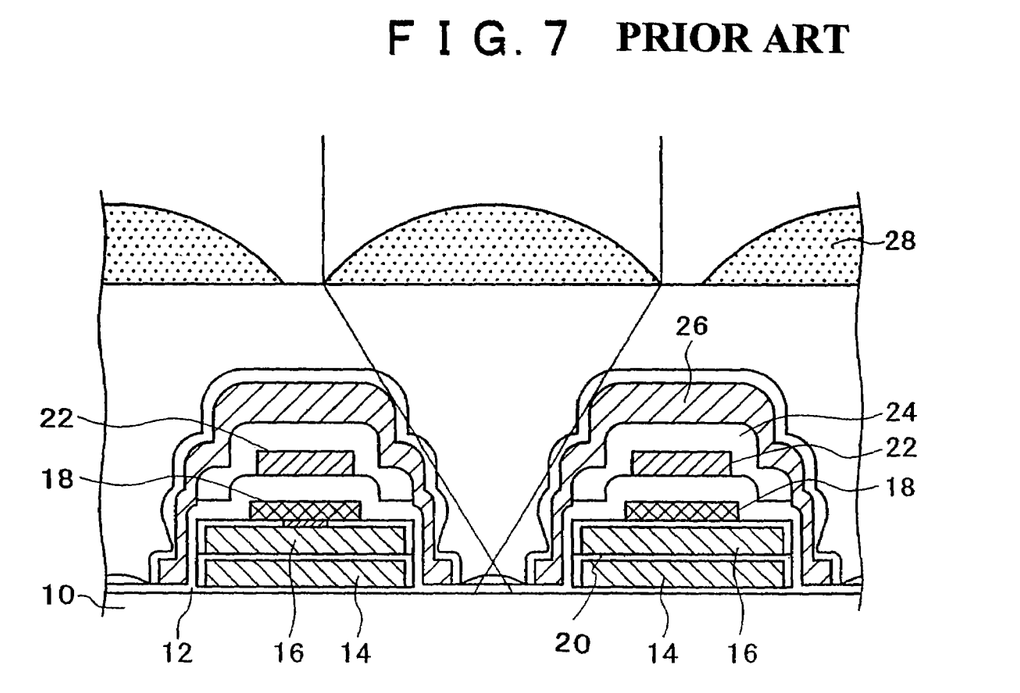
FIG. 7 is a partially sectional view showing the structure of a portion at and around a pixel of a CCD image sensor using a shunt structure according to the related art.

FIG. 7 is a partially sectional view showing the structure of a portion at and around a pixel of a CCD image sensor using the above-mentioned shunt structure, illustrating an example in which a buffer wring is provided between the transfer-accumulation electrode and the shunt wiring. In FIG. 7, a photo-sensor (not shown) and a CCD vertical transfer register (not shown) for constituting an image pickup pixel are provided in the inside of a Si substrate 10. Transfer-accumulation electrodes 14 and 16 in a two-layer structure are laminated above the upper surface of the Si substrate 10 in a region corresponding to the CCD vertical transfer register, with an insulating film 12 such as a silicon oxide film therebetween, and the buffer wiring 18 is provided above the upper surface thereof. The transfer-accumulation electrodes 14 and 16 are formed of poly-Si, and the buffer wiring 18 is formed of poly-Si or polycide (a two-layer structure film composed of polycrystalline silicon and a silicide [a silicon compound of a high melting point metal]). Incidentally, an insulating film between the transfer-accumulation electrodes 14, 16 and the buffer wiring 18 is provided with a contact window at an appropriate position, and the buffer wiring 18 is selectively connected to the transfer-accumulation electrodes 14, 16 through the contact window.

A shunt wiring 22 is provided above the upper side of the transfer-accumulation electrodes 14, 16 and the buffer wiring 18, with an insulating film 20 therebetween, and a light shielding film 26 is provided above the upper side of the shunt wiring 22, with an insulating film 24 therebetween. The shunt wiring 22 and the light shielding film 26 are formed of the above-mentioned high melting point metal or aluminum or the like. In addition, though omitted in FIG. 7, the insulating film 20 between the shunt wiring 22 and the buffer wiring 18 is provided with a contact window at an appropriate position, and the shunt wiring 22 is selectively connected to the buffer wiring 18 through a contact formed of a high melting point metal, which is provided in the contact window. Above the upper side of this assembly, an on-chip microlens 28 is laminated, with an upper insulating film, an in-layer lens functioning also as a planarizing film, and an on-chip filter therebetween. Incidentally, in a shunt structure that does not include the buffer wiring 18, the shunt wiring 22 and the transfer-accumulation electrodes 14, 16 are directly connected to each other by the contact window and the contact.

However, in the conventional shunt structure mentioned above, in the case where a high melting point metal is used as the material of the shunt wiring, there is the problem that a heat treatment conducted after the formation of the insulating film above the light shielding film 26 would raise the contact resistance between the shunt wiring 22 and the transfer-accumulation electrodes 14, 16 or the buffer wiring 18. On the other hand, where aluminum is used as the material of the shunt wiring, recovery of faults in the substrate by the heat treatment after the formation of the insulating film above the light shielding film 26 cannot be conducted, a dark current is increased, and it is necessary to enlarge the thickness of the inter-layer insulating film, so that the film thickness from the surface of the Si substrate 10 to the top end of the light shielding film 26 is increased, and the light utilization efficiency is lowered.

As a countermeasure against the above problems, a proposal has been made in which the shunt wiring 22 is composed of a laminate film of a high melting point metal nitride or oxide layer and a high melting point metal layer thereon. This constitution ensures that, even where a heat treatment for recovery of faults in the substrate is conducted, for example, after the formation of the insulating film above the light shielding film 26, the volume expansion due to the reaction between the high melting point metal layer and the silicon material disposed with the high melting point metal nitride or oxide layer therebetween is prevented, so that it is possible to prevent the rise in the contact resistance between the shunt wiring 22 and the transfer-accumulation electrodes 14, 16 or the buffer wiring 18 (see Japanese Patent Laid-open No. 2001-135811).

In the solid state image pickup device constituted as above, however, although the heat treatment-induced volume expansion between the shunt wiring formed by use of the high melting point metal and the transfer-accumulation electrodes or the buffer electrode formed by use of silicon can be prevented, the high melting point nitride or oxide layer having a high resistance is left between the high melting point metal and silicon. Therefore, there has been a limit to the suppression of the contact resistance between the high melting point metal and silicon.

SUMMARY OF THE INVENTION

In view of the foregoing, it is an object of the present invention to provide a solid state image pickup device and a method of fabricating the same by which it is possible to suppress a rise in contact resistance attendant on a heat treatment in a later step, in a structure wherein there is provided a contact between various wirings and a light shielding film using a high melting point metal and a Si substrate and Si-containing electrodes, wirings, or the like conductive patterns, to improve propagation characteristics of various signals, and to contribute to provision of an image pickup device with a higher speed, a larger size, a higher image quality, etc.

In order to attain the above object, according to one aspect of the present invention, there is provided a solid stage image pickup device including a substrate provided with a photo-sensor or the like, a conductive pattern formed above the substrate, an insulating film provided above the substrate in the state of covering the conductive pattern, and a metallic pattern formed above the insulating film in contact with the substrate or the conductive pattern through a contact window formed in the insulating film. Specifically, a metallic pattern portion in the vicinity of the bottom surface of the contact window may contain at least one of silicon metal oxide or silicon metal nitride.

Here, the conductive pattern is a transfer electrode and/or a buffer wiring connected thereto, which is composed of silicon, in the case where the solid state image pickup device is a CCD image sensor, for example. In the case where the solid image pickup device is a CMOS image sensor, the conductive pattern is a gate electrode for performing selection, transfer, amplification, resetting, or the like and/or a buffer wiring connected thereto, which is composed of silicon. The metallic pattern is a wiring for impressing a voltage on the conductor pattern or a light shielding film covering the conductive pattern. The contact window is disposed between the conductive pattern and the wiring, or between the substrate and the light shielding film.

In the solid state image pickup device constituted as above, the metallic pattern portion in the vicinity of the bottom surface of the contact window contains at least one of silicon metal oxide or silicon metal nitride. With this constitution, the contact resistance between the metallic pattern and the layer therebeneath (namely, the substrate or the conductive pattern) is lowered, as compared with the case where a layer forming metallic oxide or metallic nitride is sandwiched therebetween.

According to another aspect of the present invention, there is provided a method of fabricating a solid state image pickup device in which, first, an insulating film covering a conductive pattern (namely, the above-mentioned transfer electrode, the buffer wiring, or the like) formed above a substrate is provided with a contact window reaching the substrate or the conductive pattern. Next, the bottom surface of the contact window is covered with a thin film composed of at least one of silicon oxide and silicon nitride. Subsequently, a metallic pattern (namely, the above-mentioned shunt wiring or the light shielding film) is formed above the upper side of the insulating film. At a bottom portion of the contact window, the metallic pattern is so shaped as to be connected to the substrate or the conductive pattern via the thin film. Thereafter, a heat treatment is conducted to cause the silicon oxide or silicon nitride constituting the thin film and the metal constituting the metallic pattern to react with each other at the bottom surface portion of the contact window, thereby contriving a lowering of the connection resistance between the substrate or the conductive pattern and the metallic pattern.

In the above fabricating method, the heat treatment is conducted in the condition where the thin film composed of silicon oxide or silicon nitride is provided between the substrate or the conductive pattern and the metallic pattern. In the heat treatment in such a condition, the silicon oxide or silicon nitride constituting the thin film and the metal constituting the metallic pattern are caused to react with each other, whereby volume expansion due to the formation of a metallic silicide is prevented, even where the substrate or the conductive pattern is composed of silicon. Moreover, the reaction between the silicon oxide or silicon nitride constituting the thin film and the metal constituting the metallic pattern results in that the metallic pattern portion in the vicinity of the bottom surface of the contact window contains silicon metal oxide or silicon metal nitride. This leads to a lowering of the contact resistance between the metallic pattern and the layer therebeneath (namely, the substrate or the conductive pattern), as compared with the case where a metallic oxide layer or a metallic nitride layer is sandwiched therebetween. Therefore, while a heat treatment for recovery of faults in the substrate, for example, or a heat treatment for forming an in-layer lens at an upper portion is conducted, a further lowering of the connection resistance at the bottom portion of the contact window can be contrived in the heat treatment.

As has been mentioned above, according to the solid state image pickup device of the present invention, the contact portion between the metallic pattern such as a shunt wiring, a light shielding film, etc. and the conductive pattern composed of silicon such as the substrate, the transfer electrode, etc. contains silicon metal oxide or silicon metal nitride. As a result, the connection resistance at the connection portion can be suppressed, as compared with the case where a layer forming metallic oxide or metallic nitride is sandwiched between the metallic pattern and the conductive pattern. Therefore, it is possible to connect the wiring and the electrode with a low resistance, to improve propagation characteristics of various signals, to transfer a signal such as a clock pulse at a high speed without causing deterioration of the waveform, and to contrive to provision of an image pickup device with a higher speed, a larger size, a higher image quality, etc.

Besides, according to the method of fabricating a solid state image pickup device of the present invention, a heat treatment is conducted under the condition where a thin film composed of silicon oxide or silicon nitride is laminated at the connection portion between the metallic pattern such as a shunt wiring, a light shielding film, etc. and the conductive pattern such as a substrate, a transfer electrode, etc., whereby it is possible to contrive a further lowering of resistance at the connection portion while preventing the volume expansion at the connection portion. Accordingly, it is possible to connect the wiring and the electrode with a low resistance, to improve propagation characteristics of various signals, to transfer a signal such as a clock pulse at a high speed without causing deterioration of the waveform, and to contribute to provision of an image pickup device with a higher speed, a larger size, a higher image quality, etc.

BRIEF DESCRIPTION OF THE DRAWINGS

These and other objects of the invention will be seen by reference to the description, taken in connection with the accompanying drawings, in which.

DETAILED DESCRIPTION OF THE PREFERRED EMBODIMENTS

Now, an embodiment of the present invention will be described in detail below, referring to the drawings. The following embodiment is a specific example of application of the present invention to a CCD image sensor, and technically preferable various limitations are added thereto, but the scope of the present invention is not limited to the embodiments, unless a description that the present invention is to be limited is particularly given in the following description.

<Solid State Image Pickup Device>

Figure 1A:
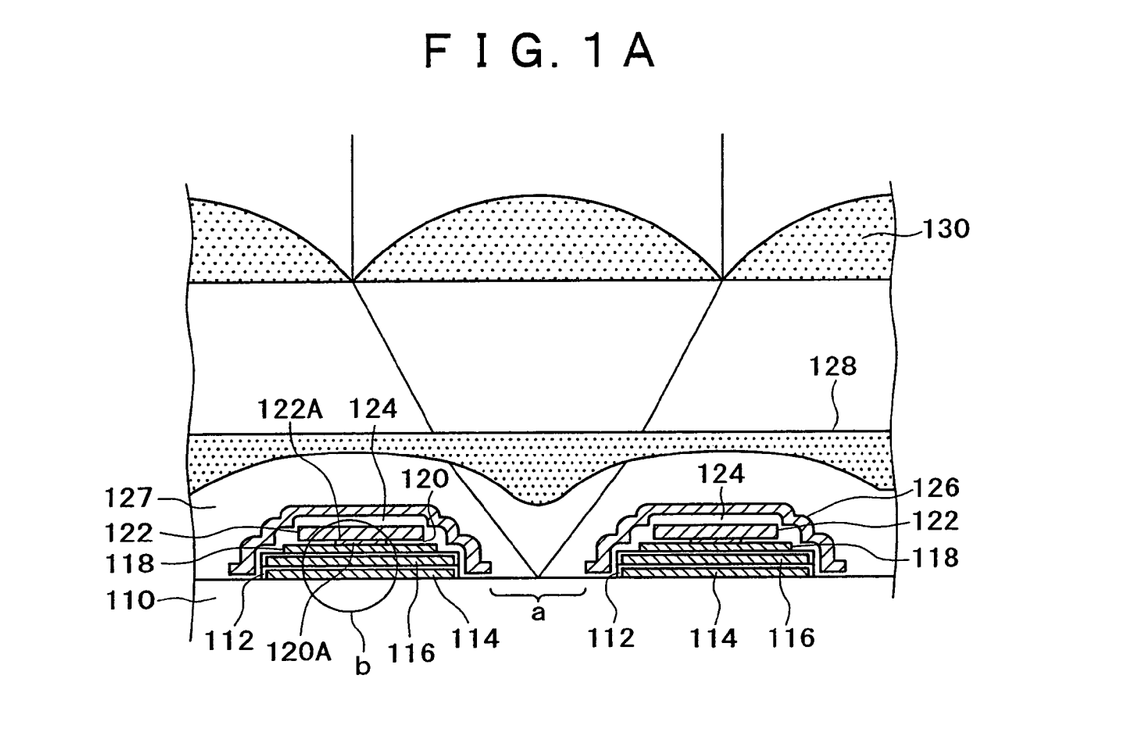
FIGS. 1A and 1B are partially sectional views showing the structure of a portion at and around a pixel of a CCD image sensor using a shunt structure according to an embodiment of the present invention.
Figure 1B:
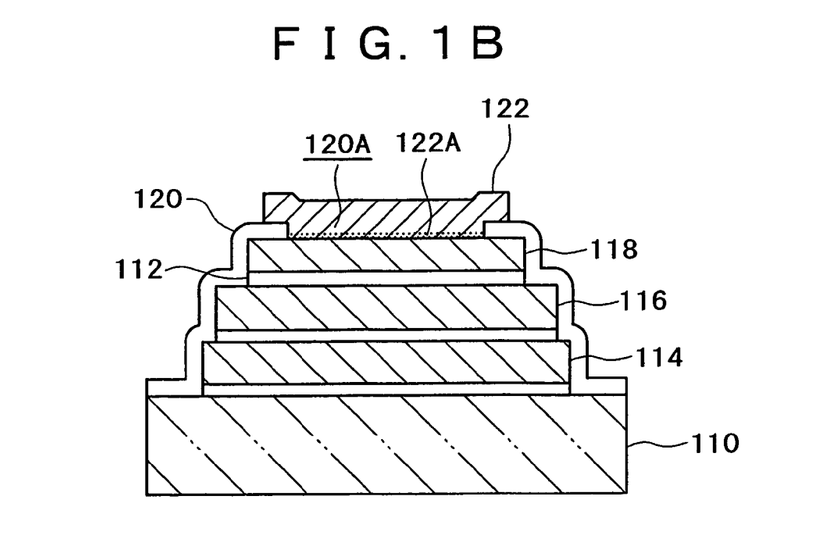
Figure 2:
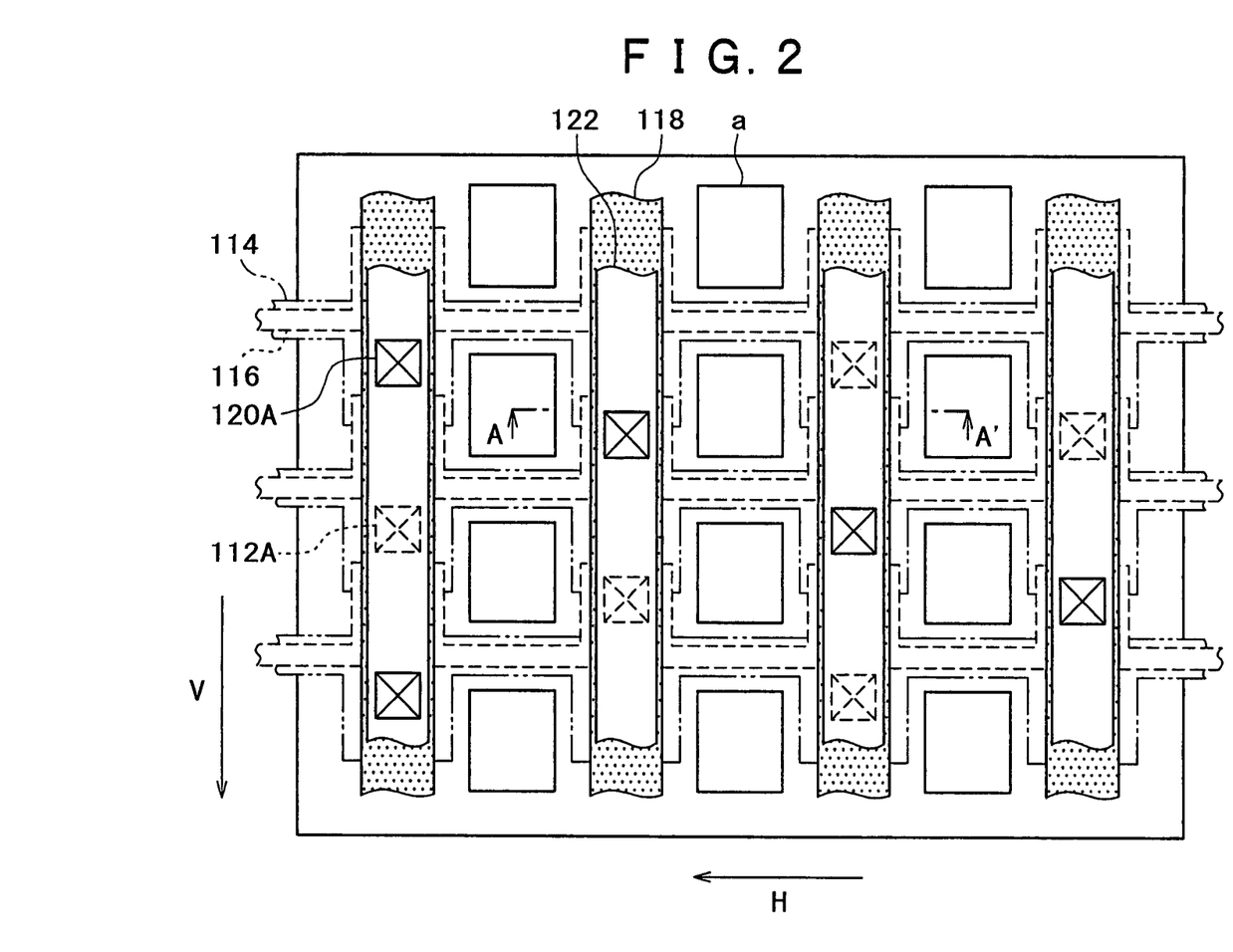
FIG. 2 is a general plan view showing the structure of a portion at and around the pixel of the CCD image sensor using the shunt structure according to the embodiment of the present invention.

FIGS. 1A, 1B, and 2 are schematic views of a portion at and around a pixel of a CCD image sensor using a shunt structure according to an embodiment of the present invention, illustrating an example where a buffer wiring is provided between a transfer-accumulation electrode and a shunt wiring. Of these figures, FIG. 1A is an A–A' sectional view (a sectional view taken along a horizontal transfer direction H orthogonal to a vertical transfer direction V) in a general plan view of an image pickup region of a solid state image pickup device shown in FIG. 2, and FIG. 1B is an enlarged sectional view of part 'b' of FIG. 1A. In the general plan view of FIG. 2, only layers in a device portion are shown, and insulating films are omitted.

As shown in these figures, a photo-sensor (not shown) and a CCD vertical transfer register (not shown) are provided in the inside of a Si substrate 110. Transfer-accumulation electrodes 114, 116 of a two-layer structure are laminated above the upper surface of the Si substrate 110 in a region corresponding to the CCD vertical transfer register, with an insulating film 112 such as a silicon oxide film therebetween, and a buffer wiring 118 extending in the vertical transfer direction V is provided above the upper surface of the transfer-accumulation electrodes 114, 116. The transfer-accumulation electrodes 114, 116 are formed of poly-Si, and the buffer wiring 118 is formed of poly-Si or polycide including a silicide laminated on poly-Si. An insulating film 112 between the transfer-accumulation electrodes 114, 116 and the buffer wiring 118 is provided with a contact window 112A (shown only in the plan view) at an appropriate position, and the buffer wiring 118 and the transfer-accumulation electrodes 114, 116 are selectively connected to each other via the contact window 112A.

A shunt wiring 122 extending in the vertical transfer direction V is provided above the upper side of the transfer-accumulation electrodes 114, 116 and the buffer wiring 118, with an insulating film 120 therebetween. The shunt wiring 122 is formed as a metallic pattern and is particularly composed of a high melting point metal such as tungsten (W). The insulating film 120 between the shunt wiring 122 and the buffer wiring 118 is provided with a contact window 120A at an appropriate position, and the shunt wiring 122 and the buffer wiring 118 are selectively connected to each other by a contact 122A disposed in the contact window 120A. Incidentally, in the enlarged sectional view in FIG. 1B, the portion where the contact window 120A and the contact 122A are formed is shown.

Particularly, the contact 122A has a constitution in which at least one of silicon metal oxide or silicon metal nitride is contained in the portion of the shunt wiring 122 in the vicinity of the bottom surface of the contact window 120A. Namely, the portion of the shunt wiring 122 in the vicinity of the bottom surface of the contact window 120A has a constitution in which at least one of silicon metal oxide or silicon metal nitride is contained in the high melting point metal constituting the shunt wiring 122. Incidentally, the contained material may be contained in the buffer wiring 118 in the region near the contact window 120A. Besides, the contained material may be an oxynitride of silicon and the metal.

As shown in FIGS. 1A and 1B, a light shielding film 126 is formed in the state of covering the shunt wiring 122, the buffer wiring 118, and the transfer-accumulation electrodes 114, 116, with an insulating film 124 therebetween. The light shielding film 126 is formed as a metallic pattern so shaped as to open at a light receiving portion 'a' where the photo-sensor is formed, and is formed, for example, of a high melting point metal. Further, an on-chip microlens 130 is laminated above the upper side of the light shielding film 126, with an upper insulating film 127, an in-layer lens 128 functioning also as a planarizing film, and a color or black on-chip filter (omitted in FIG. 1) therebetween.

<Fabricating Method>

Figure 3A:
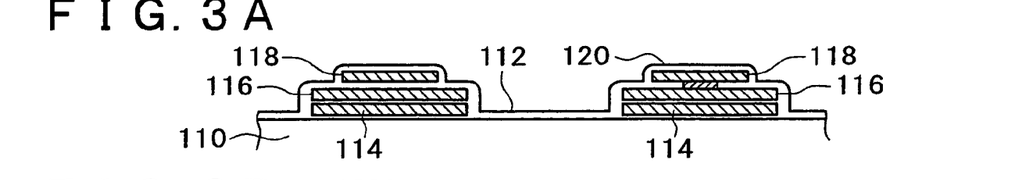
FIGS. 3A to 3E are sectional views illustrating the steps for fabricating the CCD image sensor shown in FIG. 1.

FIGS. 3A to 3E are sectional views illustrating the steps of fabricating the CCD image sensor according to this embodiment as above. First, FIG. 3A shows the condition where the transfer-accumulation electrodes 114, 116 and the buffer wiring 118 are formed above the Si substrate 110, with the insulating film (Si oxide film) 112 therebetween.

Figure 3B:
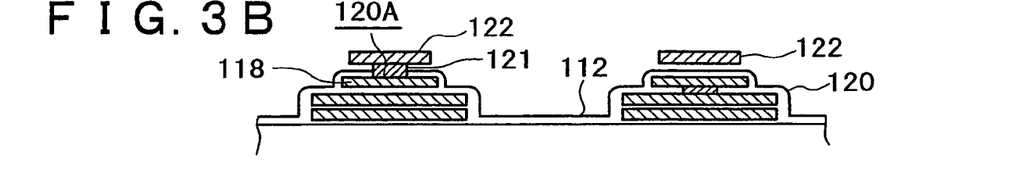

Next, as shown in FIG. 3B, the insulating film 120 is formed above the Si substrate 110 in the state of covering the transfer-accumulation electrodes 114, 116 and the buffer wiring 118, and then the insulating film 120 is provided with the contact window 120A reaching the buffer wiring 118. The thin film 121 composed of at least one of silicon oxide and silicon nitride is formed in the state of covering the bottom surface of the contact window 120A. Further, the shunt wiring 122 in such a shape as to be connected to the buffer wiring 118 at the bottom portion of the contact window 120A through the thin film 121 is formed.

Figure 4A:
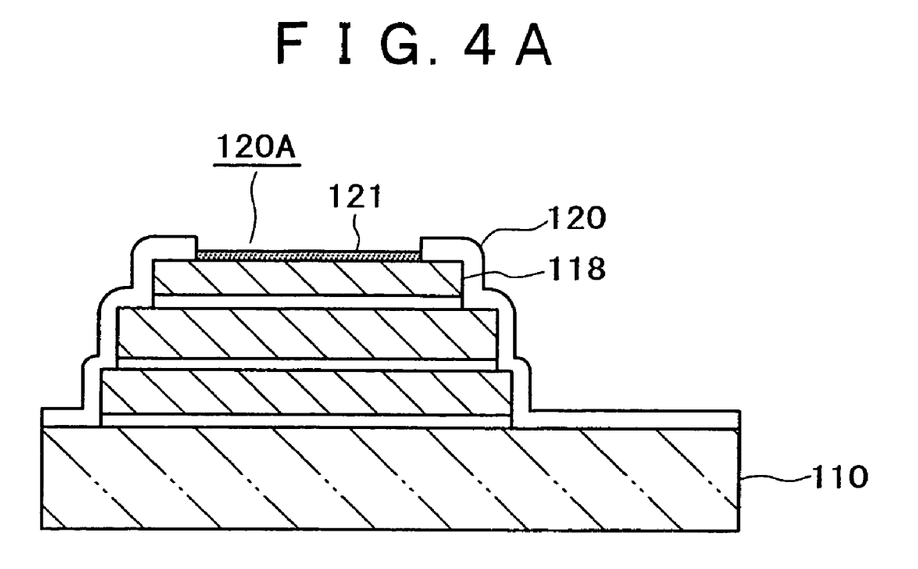
FIGS. 4A and 4B are sectional views illustrating in detail the step of FIG. 3B.
Figure 4B:
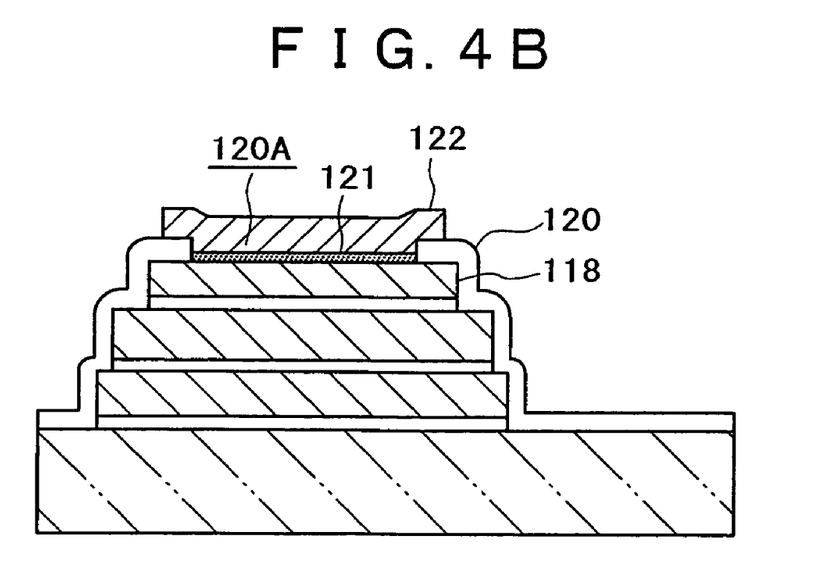

One specific example of this step will be described by use of FIGS. 4A and 4B. First, as shown in FIG. 4A, the insulating film 120 formed above the Si substrate 110 is provided with the contact window 120A reaching the buffer wiring 118. Next, an oxidizing treatment, a nitriding treatment, or an oxynitriding treatment is conducted as a treatment of the surface of the buffer wiring 118 exposed at the bottom surface of the contact window 120A, whereby the thin film 121 composed of silicon oxide, silicon nitride, or silicon oxynitride is grown above the exposed surface of the buffer wiring 118 composed of poly-Si or polycide. Thereafter, as shown in FIG. 4B, a high melting point metal film is formed above the upper side of the thin film 121 and the insulating film 120, and then the high melting point metal layer is patterned, to thereby form the shunt wiring 122 connected to the buffer wiring 118 at the bottom portion of the contact window 120A via the thin film 121.

Figure 5A:
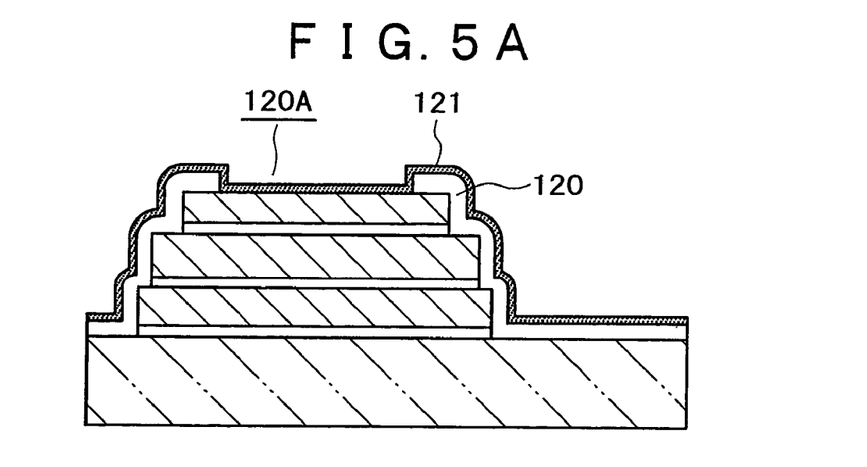
FIGS. 5A and 5B are sectional views illustrating in detail another example of the step of FIG. 3B.
Figure 5B:
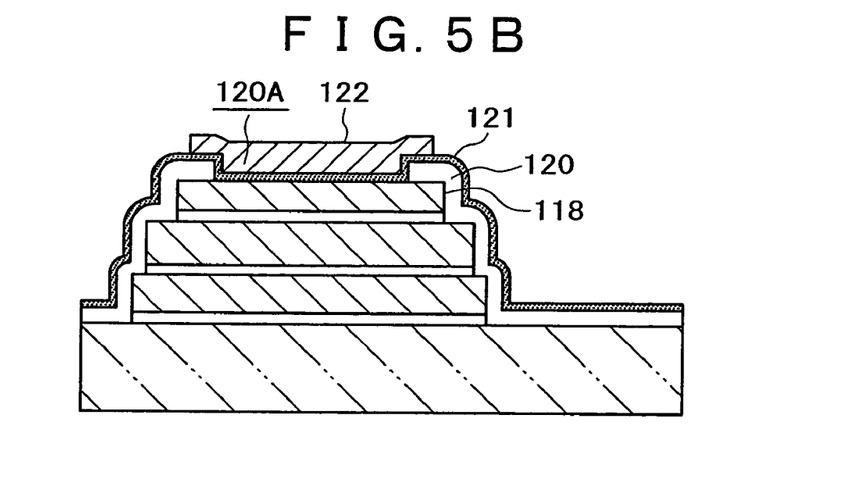

Besides, the step of FIG. 3B may be conducted by the procedure described below referring to FIGS. 5A and 5B. First, as shown in FIG. 5A, the insulating film 120 formed above the Si substrate 110 is provided with the contact window 120A reaching the buffer wiring 118. Next, the thin film 121 composed of silicon oxide, silicon nitride, or silicon oxynitride is formed above the insulating film 120 in the state of covering the inside wall of the contact window 120A. Thereafter, as shown in FIG. 5B, a high melting point metal film is formed above the upper side of the thin film 121, and then the high melting point metal film is patterned, to thereby form the shunt wiring 122 connected to the buffer wiring 118 at the bottom portion of the contact window 120A via the thin film 121.

Figure 3C:
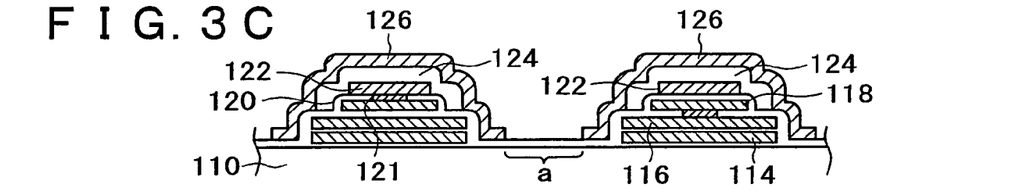

After the thin film 121 and the shunt wiring 122 are formed by either of the above-described procedures, the step of FIG. 3C is conducted, in which the upper insulating film 124 covering the shunt wiring 122 and the light shielding film 126 are formed, and only the light receiving portion 'a' is exposed from the light shielding film 126.

Figure 3D:
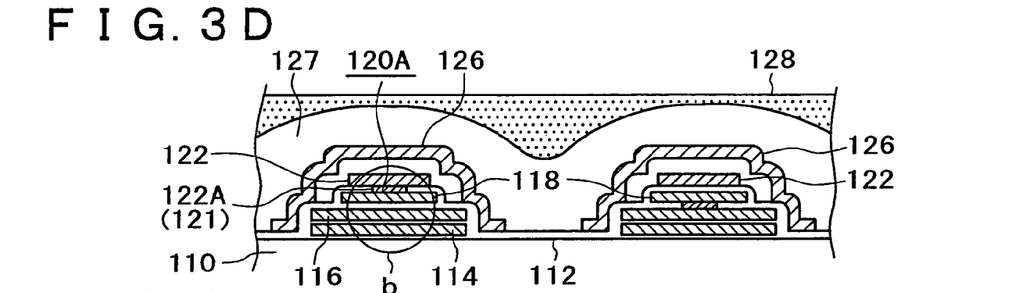

Next, as shown in FIG. 3D, a fluid insulating film such as BPSG (Boron Phosphorus Silicate Glass) is formed as an upper insulating film 127 above the Si substrate 110 provided with the light shielding film 126. The upper insulating film 127 is formed along the shape of the light shielding film 126 and the like so as to retain the surface shape. Thereafter, a heat treatment is conducted, whereby the upper insulating film 127 is brought into reflow, the surface thereof is formed into a lens shape, faults having been generated in the Si substrate 110 during the previous steps are recovered, and the interfacial level is lowered.

The heat treatment serves also as a step of forming the contact 122A on the bottom surface of the contact window 120A. Namely, the heat treatment causes the silicon oxide or silicon nitride of the thin film 121 covering the bottom surface of the contact window 120A and the metal (high melting point metal) constituting the shunt wiring 122 on the upper side to react sufficiently with each other. As a result, as shown in FIG. 1B above, the portion of the shunt wiring 122 in the vicinity of the bottom surface of the contact window 120A is made to be the contact 122A containing at least one of silicon metal oxide or silicon metal nitride.

Therefore, the heat treatment serving also as the above-described steps is conducted at 800 to 900° C. for not less than 5 min, preferably for a time of 5 min to 1 hr.

Figure 6:
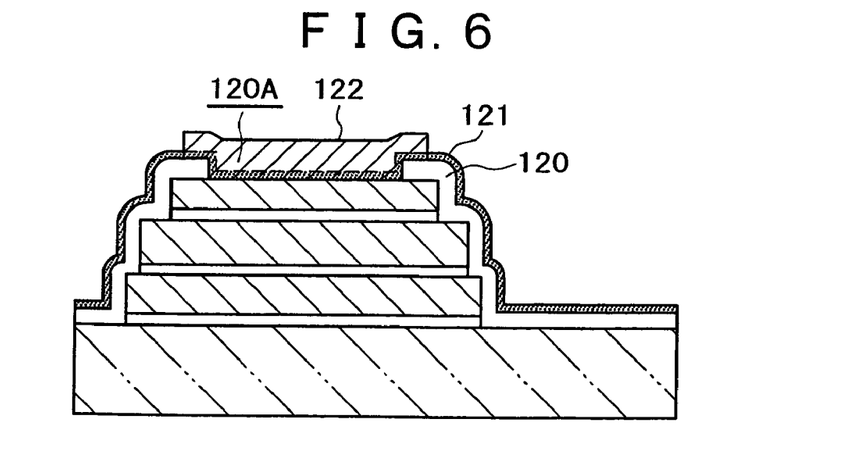
FIG. 6 is an enlarged sectional view of an essential part in the case where the step of FIGS. 5A and 5B is adopted.

Incidentally, where the thin film 121 is formed by the procedure described above referring to FIGS. 5A and 5B, the heat treatment causes the thin film 121 and the metal (high melting point metal) constituting the shunt wiring 122 react with each other over the entire area of the bottom portion of the shunt wiring 122, as shown in FIG. 6. Therefore, at least one of silicon metal oxide or silicon metal nitride is contained over the entire area of the bottom portion of the shunt wiring 122. Besides, in this case, the silicon oxide or silicon nitride does not react with the metal constituting the shunt wiring 122 in the area where the shunt wiring 122 is not provided above the upper side. Therefore, in this area, the thin film 121 is maintained in the state of silicon oxide or silicon nitride, so that this portion of the thin film 121 functions as the insulating film.

After the heat treatment as described above, the process returns to FIG. 3D, in which a material having a refractive index higher than that of the upper insulating film 127 having a surface formed into a lens shape is laminated on the upper insulating film 127, and the upper surface thereof is planarized, to form the in-layer lens 128.

Figure 3E:
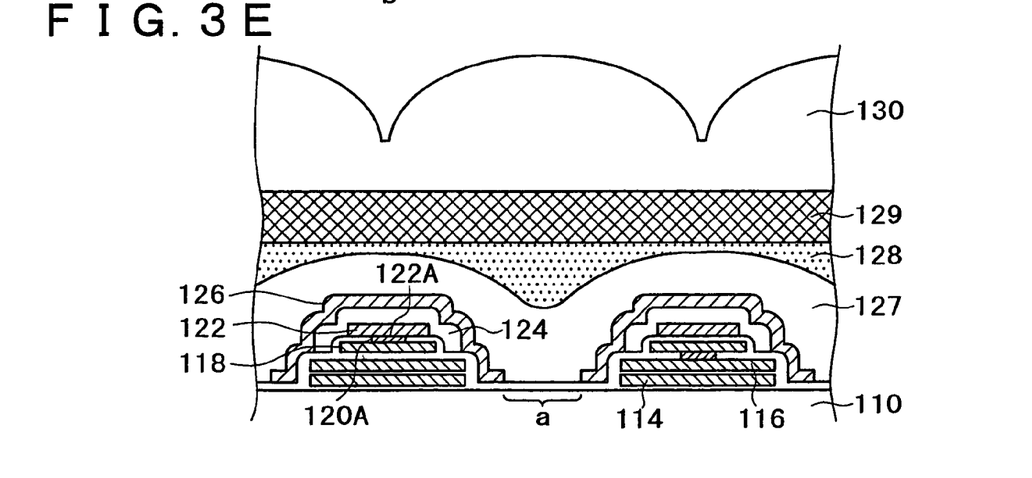

Next, as shown in FIG. 3E, a color or black on-chip filter 129 is formed on the planarized surface of the in-layer lens 128, and the on-chip microlens 130 is formed thereon in correspondence with the light receiving portion 'a'. In this manner, the CCD image sensor (solid state image pickup device) described above referring to FIGS. 1A and 1B is completed.

In the structure according to this embodiment described above, as has been described referring to FIG. 3D, the heat treatment is conducted under the condition where the thin film 122 composed of silicon oxide, silicon nitride, or silicon oxynitride is provided between the buffer wiring 118 composed of silicon and the shunt wiring 122 composed of the high melting point metal, whereby the thin film 121 and the high melting point metal can be caused to react with each other, whereby silicon metal oxide or silicon metal nitride is contained in the portion of the shunt wiring 122 in the vicinity of the interface with the buffer wiring 118, while preventing the volume expansion due to the formation of a metallic silicide. This ensures that the connection resistance between the shunt wiring 122 and the buffer wiring 118 can be lowered, as compared with the case where a metallic oxide layer or a metallic nitride layer is sandwiched in this area. In addition, the heat treatment leads to recovery from faults in the Si substrate 110 and to formation of the lens shape of the in-layer lens 128. Therefore, even where the heat treatment for recovery from the faults in the Si substrate 110 and for formation of the lens shape of the in-layer lens 128 is conducted after the formation of the connection shape between the buffer wiring 118 composed of silicon and the shunt wiring 122 composed of the high melting point metal, it is possible to contrive a further lowering of the connection resistance between the buffer wiring 118 and the shunt wiring 122.

As a result, propagation delay in the CCD image sensor can be reduced, and clock pulses and the like transmitted through the wirings can be transmitted over a long distance and at a high speed without causing deterioration of the waveform, so that an image pickup device with a higher driving speed and a larger area can be realized. Besides, this makes it possible to realize an image pickup device with a higher sensitivity, less smearing, a lower dark current, etc.

While the shunt structure having the buffer wiring 118 has been described in the above embodiments, the present invention is not limited to the above embodiments, and various modifications are possible without departing from the gist of the present invention. Upon such modifications, the same effects as above can be obtained.

For example, the present invention is similarly applicable to a shunt structure not having the buffer wiring 118. In this case, in the procedure of the fabricating method described above, the insulating film covering the transfer-accumulation electrodes 114, 116 is provided with a contact window reaching the transfer-accumulation electrodes 114, 116, the thin film 121 is formed at the bottom portion of the contact window, then the step of forming the shunt wiring 122 is conducted, and the subsequent steps are conducted in the same manner as in the above-described embodiment.

In addition, while an example of application of the present invention to the contact structure between the shunt wiring and the conductive pattern therebeneath has been described in the above embodiment, the present invention is not limited to this example, and the present invention is widely applicable to the cases where various wirings composed of a high melting point metal and the Si substrate or a Si-containing various electrodes (conductive pattern) are laminated on each other, with an insulating film therebetween, and are brought into contact with each other. For example, in a solid stage image pickup device, the above-mentioned light shielding film 126 may in some cases be maintained at an earth potential by contact with the Si substrate 110. In the solid state image pickup device with such a structure, the contact window reaching the Si substrate 110 is formed, the thin film 121 is formed at the bottom portion of the contact window, then the step of forming the light shielding film 126 so as to be connected to the Si substrate 110 at the bottom portion of the contact window via the thin film 121 is conducted, and the subsequent steps are conducted in the same manner as in the above-described embodiment. In this way, the present invention is applicable also to a solid state image pickup device not having the shunt structure.

Besides, an example of a CCD image sensor has been shown in the above embodiment, the present invention is not limited to CCD image sensors but applicable also to CMOS image sensors. In the case of a CMOS image sensor, for example, a transfer gate electrode for reading an electric charge from a photo-sensor provided at a light receiving portion 'a' may in some cases be composed of silicon, and a wiring composed of a metallic material is formed above, and in connection with, the transfer gate electrode. In this case, a contact window reaching the transfer gate electrode is formed, a thin film is formed at a bottom portion of the contact window, then a step of forming the wiring is conducted, and the subsequent steps are conducted in the same manner as in the above-described embodiment.

Furthermore, while the case where the metallic pattern such as the shunt wiring and the light shielding film to be connected to the substrate or the conductive pattern composed of silicon is composed of a high melting point metal has been described in the above embodiment, the present invention is applicable also to the case where the metallic pattern is composed of aluminum. Upon such application, the same effects as above can be obtained. It should be noted, however, that in the heat treatment described above referring to FIG. 3D, process condition suitable for the silicon oxide or silicon nitride constituting the thin film and aluminum to react sufficiently with each other are set, within such a range as not to adversely affect the characteristics of the metallic pattern composed of aluminum.

What is claimed is:

1. A solid state image pickup device comprising:
   a conductive pattern formed on a substrate;
   an insulating film provided on said substrate in the state of covering said conductive pattern; and
   a metallic pattern formed on said insulating film and making contact with said conductive pattern through a contact window formed in said insulating film,
   wherein,
   said metallic pattern at said contact window contains at least one of an oxide of silicon and a metal and a nitride of silicon and a metal.

2. A solid state image pickup device comprising:
   an insulating film provided on a substrate; and
   a metallic pattern formed on said insulating film and making contact with said substrate through a contact window formed in said insulating film,
   wherein,
   said metallic pattern at said contact window contains at least one of an oxide of silicon and a metal and a nitride of silicon and a metal.

3. The solid state image pickup device as set forth in claim 1, wherein said metallic pattern is provided as a shunt wiring for impressing a voltage on said conductive pattern, and said substrate is comprised of silicon.

4. The solid state image pickup device as set forth in claim 2, wherein said metallic pattern is provided as a light shielding film, and said substrate is comprised of silicon.

5. The solid state image pickup device as set forth in claim 1, wherein an in-layer lens having a planarized surface is provided on the upper side of said substrate.

6. The solid state image pickup device as set forth in claim 1, wherein the metal of said metallic pattern is the same as said metal.

7. The solid state image pickup device as set forth in claim 2, wherein the metal of said metallic pattern is the same as said metal.

8. The solid state image pickup device as set forth in claim 1, wherein said metal is a high melting point metal.

9. The solid state image pickup device as set forth in claim 2, wherein said metal is a high melting point metal.

* * * * *